(12) United States Patent
Smalley et al.

(10) Patent No.: US 7,008,563 B2
(45) Date of Patent: *Mar. 7, 2006

(54) POLYMER-WRAPPED SINGLE WALL CARBON NANOTUBES

(75) Inventors: Richard E. Smalley, Houston, TX (US); Daniel T. Colbert, Houston, TX (US); Ken A. Smith, Katy, TX (US); Michael O'Connell, Houston, TX (US)

(73) Assignee: William Marsh Rice University, Houston, TX (US)

(*) Notice: Subject to any disclaimer, the term of this patent is extended or adjusted under 35 U.S.C. 154(b) by 445 days.

This patent is subject to a terminal disclaimer.

(21) Appl. No.: 09/935,994

(22) Filed: Aug. 23, 2001

(65) Prior Publication Data

US 2002/0046872 A1 Apr. 25, 2002

Related U.S. Application Data

(60) Provisional application No. 60/268,269, filed on Feb. 13, 2001, provisional application No. 60/227,604, filed on Aug. 24, 2000.

(51) Int. Cl.
*H01B 1/24* (2006.01)
*C01B 3/04* (2006.01)
*C01B 31/00* (2006.01)

(52) U.S. Cl. .............. 252/511; 423/445 R; 524/495
(58) Field of Classification Search .......... 252/502, 252/511; 423/445 R, 460, 461; 524/495, 524/496; 204/164
See application file for complete search history.

(56) References Cited

U.S. PATENT DOCUMENTS 5,560,898 A * 10/1996 Uchida et al. .............. 423/461

| 6,576,341 B1 * | 6/2003 | Davey et al. ............... 428/376 |
| 6,630,772 B1 * | 10/2003 | Bower et al. ............... 313/311 |
| 6,749,712 B1 * | 6/2004 | Kuper ......................... 156/296 |
| 2002/0092613 A1 * | 7/2002 | Kuper ......................... 156/296 |
| 2003/0075682 A1 * | 4/2003 | Colbert et al. .............. 250/306 |

FOREIGN PATENT DOCUMENTS

EP 0 949 199 A1 10/1999
EP 0 989 579 A2 3/2000

OTHER PUBLICATIONS

U.S. Appl. No. 60/227,184, filed (Aug. 23, 2000).*
Bahr, et al., "Functionalization of Carbon Nanotubes by Electrochemical Reduction of Aryl Diazonium Salts: A Bucky Paper Electrode," *J. Am. Chem. Soc.*, vol. 123, No. 27, 2001, pp. 6536-6542.

(Continued)

*Primary Examiner*—Mark Kopec
(74) *Attorney, Agent, or Firm*—Ross Spencer Garsson; Edward T. Mickelson; Winstead Sechrest & Minick P.C.

(57) ABSTRACT

The present invention relates to new compositions of matter and articles of manufacture comprising SWNTs as nanometer scale conducting rods dispersed in an electrically-insulating matrix. These compositions of matter have novel and useful electrical, mechanical, and chemical properties including applications in antennas, electromagnetic and electro-optic devices, and high-toughness materials. Other compositions of matter and articles of manufacture are disclosed, including polymer-coated and polymer wrapped single-wall nanotubes (SWNTs), small ropes of polymer-coated and polymer-wrapped SWNTs and materials comprising same. This composition provides one embodiment of the SWNT conducting-rod composite mentioned above, and also enables creation of high-concentration suspensions of SWNTs and compatibilization of SWNTs with polymeric matrices in composite materials. This solubilization and compatibilization, in turn, enables chemical manipulation of SWNT and production of composite fibers, films, and solids comprising SWNTs.

53 Claims, 7 Drawing Sheets

OTHER PUBLICATIONS

Coleman, et al., "Percolation-dominated conductivity in a conjugated-polymer-carbon-nanotube composite," *Physical Review B*, vol. 58, No. 12, Sep. 15, 1998, pp. R7492-R7495.

Curran, et al., "A Composite from Poly(*m*-phenylenevinylene-*co*-2, 5-dioctoxy-*p*-phenylenevinylene) and Carbon Nanotubes: A Novel Material for Molecular Optoelectronics," *Adv. Mater.*, vol. 10, No. 14, 1998, pp. 1091-1093.

Dalton, et al., "A functional conjugated polymer to process, purify and selectively interact with single wall carbon nanotubes," *Synthetic Metals*, 121 (2002), pp. 1217-1218.

Grimes, et al., "The 500 MHz to 5.50 GHz complex permittivity spectra of single-wall carbon nanotube-loaded polymer composites," *Chem. Phys. Lett.*, 319 (2000), pp. 460-464.

Jurewicz, et al., "Supercapacitors from nanotubes/polypyrrole composites," *Chem. Phys. Lett.*, 347 (2001), pp. 36-40.

McCarthy, et al., "Complex nano-assemblies of polymers and carbon nanotubes," *Nanotechnology*, vol. 12 (2001), pp. 187-190.

Panhuis, et al., "Optimal polymer characteistics for nanotube solubility," *Synthetic Metals*, vol. 121 (2001), pp. 1187-1188.

O'Connell, et al., "Reversible water-solubilization of single-walled carbon nanotubes by polymer wrapping," *Chem. Phys. Lett.*, 342 (2001), pp. 265-271.

Star, et al., "Preparation and Properties of Polymer-Wrapped Single-Walled Carbon Nanotubes," *Angew. Chem. Int. Ed.*, vol. 40, No. 9 (2001), pp. 1721-1725.

Riggs, et al., "Strong Luminescence of Solubilized Carbon Nanotubes," *J. Am. Chem. Soc.*, 122 (2000), pp. 5879-5880.

Dalton, et al., "Selective Interaction of a Semiconjugated Organic Polymer with Single-Wall Nanotubes," *J. Phys. Chem. B.*, 104 (2000), 10012-10016.

Jin et al., "Nonlinear optical properties of some polymer/multi-walled carbon nanotube composites," *Chem. Phys. Lett.*, 318 (2000), pp. 505-510.

McCarthy, et al., "Microscropy studies of nanotube-conjugated polymer interactions," *Synthetic Metals*, 121 (2001), pp. 1225-1226.

Fan, et al., "Synthesis, Characterizations, and Physical Properties of Carbon Nanotubes Coated by Conducting Polypyrrole," *Journal of Applied Science*, vol. 74 (1999), 2605-2610.

Tang, et al., "Preparation, Alignment, and Optical Properties of Soluble Poly(phenylacetylene)-Wrapped Carbon Nanotubes," *Macromolecules*, vol. 32 (1999), pp. 2569-2576.

Chen, et al., "Carbon Nanotube and Polypyrrole Composites: Coating and Doping," *Adv. Mater.*, vol. 12, No. 7 (2000), pp. 522-526.

Jin et al., "Nonlinear optical properties of some polymer/multi-walled carbon nanotube composites," *Chemical Physics Letters*, vol. 318, pp. 505-510 (Mar. 3, 2000).

Coleman et al., "Percolation-dominated conductivity in a conjugated-polymer-carbon-nanotube composite," *Rapid Communications*, Physical Review B, vol. 58, No. 12, pp. R7492-R7495 (Sep. 15, 1998).

\* cited by examiner

Fig. 3A
Fig. 3B
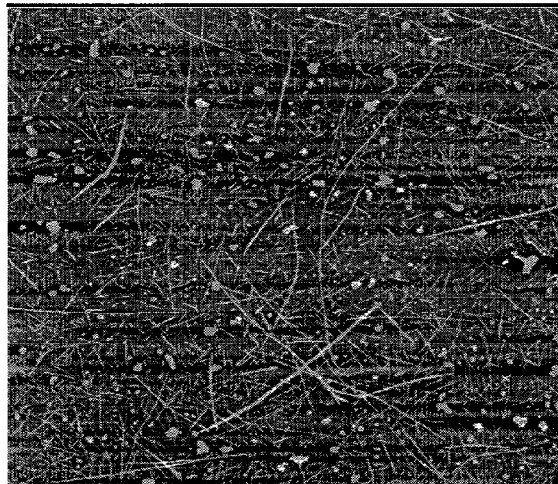
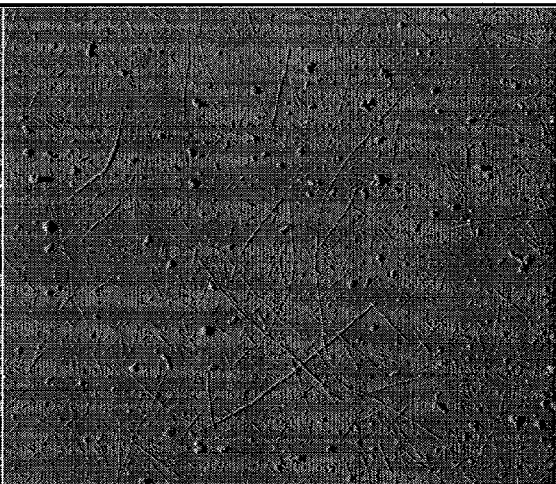
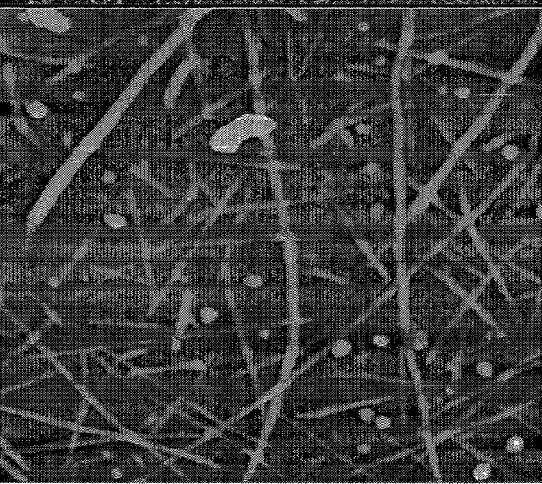
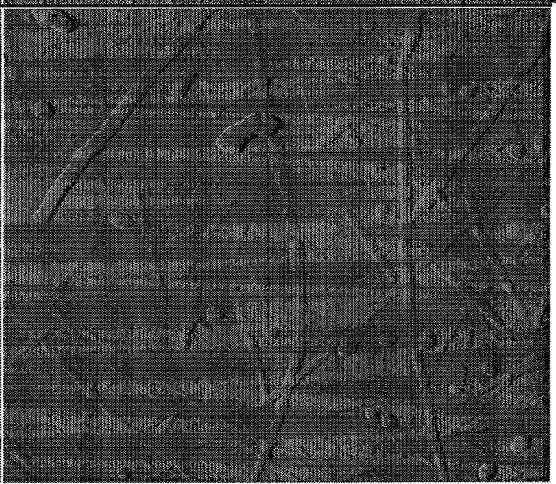
Fig. 3C
Fig. 3D

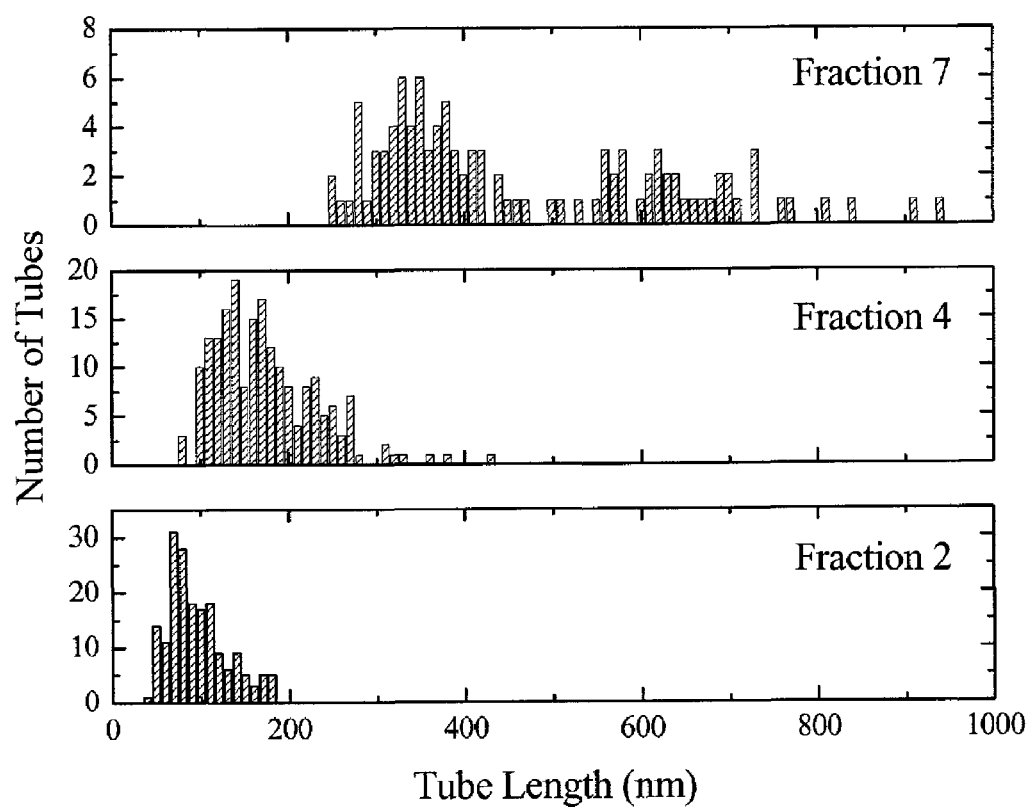

POLYMER-WRAPPED SINGLE WALL CARBON NANOTUBES

CROSS-REFERENCE TO RELATED APPLICATION

This patent application claims priority from U.S. Provisional Application No. 60/227,604, filed on Aug. 24, 2000, and from U.S. Provisional Application No. 60/268,269, filed on Feb. 13, 2001, both of which are incorporated herein by reference.

NOTIFICATION PURSUANT TO 37 C.F.R. § 1.51(c)(1)(vii)

This invention was made with U.S. Government support under Grant No. NCC9-77 awarded by the National Aeronautical and Space Administration. The U.S. Government may have certain rights in the invention.

This patent invention is related to the following corresponding PCT/U.S. Patent Applications, all of which also claim priority from the above referenced provisional patent applications and all of which PCT/U.S. Patent Applications are also incorporated herein by reference:

International Application No. PCT/US 01/26308, "POLYMER-WRAPPED SINGLE WALL CARBON NANOTUBES" to Smalley et al., filed concurrent to the date of this Application;

U.S. patent application Ser. No. 09/935,995, "POLYMER-WRAPPED SINGLE WALL CARBON NANOTUBES" to Smalley et al., filed concurrent to the date of this Application; and U.S. patent application Ser. No. 09/935,493, "POLYMER-WRAPPED SINGLE WALL CARBON NANOTUBES" to Smalley et al., filed concurrent to the date of this Application.

FIELD OF THE INVENTION

The present invention relates generally to carbon nanotubes, and more particularly relates to materials containing single-wall carbon nanotubes and non-covalently derivatized single-wall carbon nanotubes.

BACKGROUND OF THE INVENTION

Fullerenes are closed-cage molecules composed entirely of $sp^2$-hybridized carbons, arranged in hexagons and pentagons. Fullerenes (e.g., $C_{60}$) were first identified as closed spheroidal cages produced by condensation from vaporized carbon.

Fullerene tubes are produced in carbon deposits on the cathode in carbon arc methods of producing spheroidal fullerenes from vaporized carbon. Ebbesen et al. (Ebbesen I), "Large-Scale Synthesis Of Carbon Nanotubes," Nature, Vol. 358, p. 220 (Jul. 16, 1992) and Ebbesen et al., (Ebbesen II), "Carbon Nanotubes," Annual Review of Materials Science, Vol. 24, p. 235 (1994). Such tubes are referred to herein as carbon nanotubes. Many of the carbon nanotubes made by these processes were multi-wall nanotubes, i.e., the carbon nanotubes resembled concentric cylinders. Carbon nanotubes having up to seven walls have been described in the prior art. Ebbesen II; Iijima et al., "Helical Microtubules Of Graphitic Carbon," Nature, Vol. 354, p. 56 (Nov. 7, 1991).

In defining single-wall carbon nanotubes, it is helpful to use a recognized system of nomenclature. In this application, the carbon nanotube nomenclature described by M. S. Dresselhaus, G. Dresselhaus, and P. C. Eklund, Science of Fullerenes and Carbon Nanotubes, Chap. 19, especially pp. 756–760, (1996), published by Academic Press, 525 B Street, Suite 1900, San Diego, Calif. 92101-4495 or 6277 Sea Harbor Drive, Orlando, Fla. 32877 (ISBN 0-12-221820-5), which is hereby incorporated by reference, will be used. The single wall tubular fullerenes are distinguished from each other by double index (n,m) where n and m are integers that describe how to cut a single strip of hexagonal "chicken-wire" graphite so that its edges join seamlessly when it is wrapped to form a cylinder. When the two indices are the same, m=n, the resultant tube is said to be of the "arm-chair" (or n,n) type, since when the tube is cut perpendicular to the tube axis, only the sides of the hexagons are exposed and their pattern around the periphery of the tube edge resembles the arm and seat of an arm chair repeated n times. Arm-chair tubes are one form of single-wall carbon nanotubes; they are truly metallic, and have extremely high electrical conductivity. Other nanotube geometries, where (n− m)/3 is an integer are semi-metallic, i.e. they have a small band-gap and are good electrical conductors at temperatures relevant to the operation of almost all electronic materials and devices. The remaining nanotube geometries where (n−m)/3 is not an integer are semiconductors, having a band-gap in the neighborhood of 1 eV, which varies with inversely with their individual diameters. See Odom et al, J. Phys. Chem. B, vol. 104 p. 2794 (2000). In addition, all single-wall nanotubes are the stiffest molecules known, and have extremely high thermal conductivity and tensile strength. See Yakobson and Smalley, Am. Sci. vol. 85, p. 324 (1997).

Single-wall carbon nanotubes have been made in a DC arc discharge apparatus of the type used in fullerene production by simultaneously evaporating carbon and a small percentage of Group VIII transition metal from the anode of the arc discharge apparatus. See Iijima et al., "Single-Shell Carbon Nanotubes of 1 nm Diameter," Nature, Vol. 363, p. 603 (1993); Bethune et al., "Cobalt Catalyzed Growth of Carbon Nanotubes with Single Atomic Layer Walls," Nature, Vol. 63, p. 605 (1993); Ajayan et al., "Growth Morphologies During Cobalt Catalyzed Single-Shell Carbon Nanotube Synthesis," Chem. Phys. Lett., Vol. 215, p. 509 (1993); Zhou et al., "Single-Walled Carbon Nanotubes Growing Radially From $YC_2$ Particles," Appl. Phys. Lett., Vol. 65, p. 1593 (1994); Seraphin et al., "Single-Walled Tubes and Encapsulation of Nanocrystals Into Carbon Clusters," Electrochem. Soc., Vol. 142, p. 290 (1995); Saito et al., "Carbon Nanocapsules Encaging Metals and Carbides," J. Phys. Chem. Solids, Vol. 54, p. 1849 (1993); Saito et al., "Extrusion of Single-Wall Carbon Nanotubes Via Formation of Small Particles Condensed Near an Evaporation Source," Chem. Phys. Lett., Vol. 236, p. 419 (1995). It is also known that the use of mixtures of such transition metals can significantly enhance the yield of single-wall carbon nanotubes in the arc discharge apparatus. See Lambert et al., "Improving Conditions Toward Isolating Single-Shell Carbon Nanotubes," Chem. Phys. Lett., Vol. 226, p. 364 (1994).

While this arc discharge process can produce single-wall nanotubes, the yield of nanotubes is low and the tubes exhibit significant variations in structure and size between individual tubes in the mixture. Individual carbon nanotubes are difficult to separate from the other reaction products and purify.

An improved method of producing single-wall nanotubes is described in U.S. Pat. No. 6,183,714, entitled "Method of Making Ropes of Single-Wall Carbon Nanotubes," incorporated herein by reference in its entirety. This method uses, inter alia, laser vaporization of a graphite substrate doped with transition metal atoms, preferably nickel, cobalt, or a mixture thereof, to produce single-wall carbon nanotubes in yields of at least 50% of the condensed carbon. The single-wall nanotubes produced by this method are much more pure than those produced by the arc-discharge method. Because of the absence of impurities in the product, the aggregation of the nanotubes is not inhibited by the presence of impurities and the nanotubes produced tend to be found in clusters, termed "ropes," of 10 to 5000 individual single-wall carbon nanotubes in parallel alignment, held together by van der Waals forces in a closely packed triangular lattice.

PCT/US/98/04513 entitled "Carbon Fibers Formed From Single-Wall Carbon Nanotubes" and which is incorporated by reference, in its entirety, discloses, inter alia, methods for cutting and separating nanotube ropes and manipulating them chemically by derivatization to form devices and articles of manufacture comprising nanotubes. Other methods of chemical derivatization of the side-walls of the carbon nanotubes are disclosed in PCT/US99/21366 entitled "Chemical Derivatization of Single Wall Carbon Nanotubes to Facilitate Solvation Thereof, and Use of Derivatized Nanotubes," which is incorporated by reference, in its entirety.

Another method for producing single-wall carbon nanotubes is described in PCT/US99/25702, (entitled "Gas-Phase Nucleation and Growth of Single-Wall Carbon Nanotubes from High Pressure CO") incorporated herein in its entirety by reference, which describes a process involving supplying high pressure (e.g., 30 atmospheres) CO that has been preheated (e.g., to about 1000° C.) and a catalyst precursor gas (e.g., $Fe(CO)_5$) in CO that is kept below the catalyst precursor decomposition temperature to a mixing zone. In this mixing zone, the catalyst precursor is rapidly heated to a temperature that results in (1) precursor decomposition, (2) formation of active catalyst metal atom clusters of the appropriate size, and (3) favorable growth of single-wall carbon nanotubes ("SWNTs") on the catalyst clusters. Preferably a catalyst cluster nucleation agency is employed to enable rapid reaction of the catalyst precursor gas to form many small, active catalyst particles instead of a few large, inactive ones. Such nucleation agencies can include auxiliary metal precursors that cluster more rapidly than the primary catalyst, or through provision of additional energy inputs (e.g., from a pulsed or CW laser) directed precisely at the region where cluster formation is desired. Under these conditions SWNTs nucleate and grow according to the Boudouard reaction. The SWNTs thus formed may be recovered directly or passed through a growth and annealing zone maintained at an elevated temperature (e.g., 1000° C.) in which tubes may continue to grow and coalesce into ropes.

In yet another method for production, single-walled carbon nanotubes have been synthesized by the catalytic decomposition of both carbon monoxide and hydrocarbons over a supported metal catalyst. Under certain conditions, there is no termination of nanotube growth, and production appears to be limited only by the diffusion of reactant gas through the product nanotube mat that covers the catalyst. "Catalytic Growth of Single-Wall Carbon Nanotubes from Metal Particles" (PCT/US99/21367) incorporated in its entirety by reference, details a catalyst-substrate system that promotes the growth of nanotubes that are predominantly single-walled tubes in a specific size range, rather than the large irregular-sized multi-walled carbon fibrils that are known to grow from supported catalysts. This method allows bulk catalytic production of predominantly single-wall carbon nanotubes from metal catalysts located on a catalyst-supporting surface.

Carbon nanotubes, and in particular, single-wall carbon nanotubes, are useful for making electrical connectors in micro devices such as integrated circuits or in semiconductor chips used in computers because of the electrical conductivity and small size of the carbon nanotube. The carbon nanotubes are useful as antennas at optical frequencies, as constituents of non-linear optical devices, and as probes for scanning probe microscopy such as are used in scanning tunneling microscopes (STM) and atomic force microscopes (AFM). The carbon nanotubes may be used in place of or in conjunction with carbon black in tires for motor vehicles, as elements of a composite materials to elicit specific physical, chemical or mechanical properties in those materials (e.g. electrical and/or thermal conductivity, chemical inertness, mechanical toughness, etc). The carbon nanotubes themselves and materials and structures comprising carbon nanotubes are also useful as supports for catalysts used in industrial and chemical devices and processes such as fuel cells, hydrogenation, reforming and cracking.

Individual SWNT and ropes of single-wall carbon nanotubes exhibit metallic conductivity, i.e., they will conduct electrical charges with a relatively low resistance. Nanotubes and ropes of nanotubes are useful in any application where an electrical conductor is needed, for example as an additive in electrically conductive polymeric materials, paints or in coatings. Nanotubes and ropes of nanotubes have a propensity to aggregate into large networks, which are themselves electrically conductive, and this property enables them to form such networks when they are suspended in a matrix of a different material. The presence of this network alters the electrical properties of a composite that includes nanotubes.

Single-wall carbon nanotubes have outstanding properties as field-emitters for electrons, and serve well as the active element in cold-cathodes in any applications that involve emission of electrons, such as microwave power tubes and video displays.

SUMMARY OF THE INVENTION

Prior art reveals materials comprising SWNTs which have substantial bulk electrical conductivity derived from the conductive network of SWNTs. This invention provides a new class of materials that have low electrical conductivity, but contain individual nanotubes and small ropes of individual nanotubes which are themselves good electrical conductors, and serve as small conducting rods immersed in an electrically-insulating matrix. These materials represent a new composition of matter that has novel electrical and electronic properties that are distinct from those of previously known nanotube-containing materials.

This invention also provides another new composition of matter which is a single-wall carbon nanotube that is coated or wrapped with one or more polymer molecules. This coating or wrapping is one form of a non-covalent derivatization. "Coating" and "wrapping" are used interchangeably herein, and refer to the presence of a polymer molecule in contact with the exterior of a SWNT, whether the polymer molecule covers all or only part of the SWNT's exterior. The use of either "coating" or "wrapping" does not imply that the polymer is necessarily wrapped around a SWNT in a regular or symmetrical configuration. Also provided is a composition of matter comprising individual nanotubes and small ropes of nanotubes that are coated or wrapped with polymer molecules. The polymer that covers these small ropes and tubes attaches to the SWNTs through weak chemical forces that are primarily non-covalent in nature. These forces are due primarily to polarization, instead of sharing of valence electrons. Thus the properties of the SWNTs involved are substantially the same as that of free, individual SWNTs and small ropes of SWNTs. (A measured property is "substantially the same" if the measurements for this property are plus or minus twenty-five percent (±25%)). Thus SWNTs and small ropes of SWNTs that are electrically-conductive retain their individual electrical conductivity and other properties when they are coated with the polymer. Their high electrical conductivity makes the individual nanotubes highly electrically polarizable, and materials containing these highly polarizable molecules exhibit novel electrical properties, including a high dielectric constant when the SWNTs are electrically isolated from one another.

A polymer wrapping or coating greatly inhibits the Van der Waals attraction normally observed between separate SWNT and small ropes of SWNT. The polymer also interacts with solvents. The combination of the Van der Waals inhibition and polymer-solvent interaction causes the wrapped nanotubes to be much more readily suspended at high concentrations in solvents. This enables creation of high-concentration SWNT solutions and suspensions, which in turn substantially enables manipulation of SWNT into bulk materials of many kinds, including films, fibers, solids, and composites of all kinds. This invention also includes treatment of the polymer-coated SWNT to remove the polymer coating and restore the pristine SWNT.

Aggregations of polymer-coated SWNTs produce a new material that has novel electrical properties such as a high dielectric constant. The novel electrical properties are isotropic in compositions where the SWNT are essentially randomly oriented with one another, such as in an electrically-insulating matrix. Anisotropic behavior of such materials will be obtained when the SWNTs are aligned by the application of an external aligning field, such as a magnetic field, electrical field, or shear flow field. Aggregations of polymer coated SWNTs are disclosed in which the SWNTs are substantially aligned in an insulating matrix and provide a new form of electrically-conducting rod composite, where the conducting rods have cross sectional dimensions on the nanometer scale and lengths of hundreds of nanometers or more, and the electrical properties of the composite are highly anisotropic.

The polymer wrappings or coatings can be chosen to make the polymer-associated SWNTs and ropes of SWNTs compatible with matrices of other materials to facilitate fabrication of composites. Composite materials of polymer-associated SWNTs suspended in a polymer matrix, provide a new form of polymeric composite. This composite material is novel in that the structure of the nanotube suspended is (in its cross sectional dimensions) substantially smaller than the typical scale length of the individual polymer molecules in the matrix. This microscopic dimensional compatibility minimizes the propensity of the composite to fail mechanically at the interface between the matrix and the SWNTs, producing a composite material with enhanced mechanical properties such as strain-to-failure, toughness, and resistance to mechanical fatigue. This composite also has the novel electrical properties discussed above, when the properties of SWNT in the matrix allow them to be electrically isolated from one another. In embodiments where there is incomplete electrical isolation between the SWNT, the mechanical enhancement of the composite is due to the similarity of scale in both the polymer and single wall carbon nanotube. Because of this similarity the SWNT and polymer establish a substantially more intimate contact than if their dimensional scales would not have been the same.

The above described materials are useful in mechanical or structural applications where enhanced material or structural mechanical properties are desired. The materials are also useful in electronic applications requiring a high-dielectric constant material, including but not limited to, capacitor dielectrics, circuit board materials, waveguide materials, optical index-matching materials, materials that absorb electromagnetic radiation, materials that re-direct electromagnetic radiation, optoelectronic materials, antenna arrays, and materials for suspending antennas, electrically-loading antennas to change their required length, and support of antenna arrays that provides advantages in the spacing of the individual antennas. These materials also serve as the active element for a range of transducers in that they change their physical dimensions in response to applied electric and magnetic fields. Applied in a way that they can come into contact with other chemicals, they also change dimensionally and electronically in response to adsorption of chemicals on the nanotube surface, and therefore serve as chemical sensors and transducers that respond with a change of electrical and mechanical properties to the presence of specific chemicals.

For those materials in which the SWNT are mobile (such as in a suspension or solution of SWNT, produced by known means for suspending or solubilizing SWNT known in the art), the materials' mechanical, electrical and electromagnetic properties are modified by application of an electric field that changes the orientation or location of the SWNT segments contained therein. These materials enable new electro-mechanical elements, fluids with electrically-controllable viscosity, opto-electronic elements where the character (e.g. intensity, polarization) of a electromagnetic wave transmitted through the SWNT-containing material is modified as a consequence of application of an electric field to the material.

Nanometer-Scale Conducting-Rod Materials

One aspect of the present invention is directed to the creation of novel SWNT-containing materials that have novel electronic and/or electromagnetic properties derived from the electrical conductivity and high electrical polarizability of the nanotubes. The invention includes means for creation of such materials, articles of manufacture incorporating such materials, and the materials themselves.

Electrically-conductive single-wall carbon nanotubes are the first known molecules that are excellent electrical conductors. An example of this carbon polymer is shown in FIG. 1. This large molecule can easily be manipulated through chemical means well known to those skilled in the art of polymer chemistry and by new means that are specific to the nanotube structure. Means of such chemical manipulation are disclosed in PCT/US/98/04513, cited above, as well as in Chemical Derivatization of Single Wall Carbon Nanotubes to Facilitate Solvation Thereof, and Use of Derivatized Nanotubes (PCT/US99/21366), incorporated herein in its entirety by reference. This invention applies the chemical facility of this molecule to enable new materials that have novel electrical and electromagnetic properties. This invention is novel in that it creates materials from individual SWNT, on a truly molecular basis. Prior art (see Grimes et al. *Chem. Phys. Lett.*, Vol. 319, p. 460, 2000) has shown that bundles of SWNT in a polymer matrix provide a composite material with a high dielectric constant. In that work, loading a polyethyl methacrylate matrix with mechanically-ground SWNT in bundles (nanotube ropes) of ~10 nm diameter provided a material with a bulk dielectric constant ranging between 10 and 140 for SWNT loadings ranging between 4 wt % and 23 wt %, respectively. The bundle lengths in that work were ~1 to 5 microns. The theoretical work of Lagarkov and Sarychev (Phys. Rev. B, vol. 53., no. 10, p. 6318, 1996), which is incorporated by reference in its entirety, illustrates that the ultimate dielectric constant of a composite material comprising electrically conducting rods in an electrically-insulating matrix depends strongly on the aspect ratio (length divided by diameter) of the conducting rods, and that for small concentrations of rods that the dielectric constant scales as the square of the aspect ratio. The dielectric constant is dependent on the concentration of the rods, peaking at the percolation threshold for the material. The peak value attained again depends on the aspect ratio of the conducting rods. Individual SWNT and small bundles of individual SWNT are molecular "conducting rods", and composite materials comprising individual SWNT and small bundles of SWNT in an electrically-insulating matrix are a direct embodiment of the predictions of Lagarkov and Sarychev and attain dielectric constants in excess of 1000.

Such materials with tailored electronic properties such as a large dielectric constant, $\epsilon$, or a controllable electric susceptibility tensor, $\epsilon$, are of significant importance in applications that include integrated logic circuits, radio frequency circuits, antennas, and energy storage. Such materials are also useful to manipulate electromagnetic radiation within the material and at its surfaces and interfaces. The response of conducting rod composite materials also demonstrates dispersive behavior, which is dependent on the frequency of the electromagnetic field to which the material is subjected. This dispersive behavior becomes resonant when the rod length is comparable to the wavelength of the incident radiation. (Lagarkov and Sarychev Phys. Rev. B, vol. 53. p. 6318). PCT/US/98/04513 entitled "Carbon Fibers Formed From Single-Wall Carbon Nanotubes" describes means for making individual SWNT and small SWNT bundles (<10 nm in diameter) available in lengths comparable to the wavelength of visible light, and therefore enables creation of "conducting rod composites" that have novel behavior in the visible light wavelength region, which include a high absorptivity for electromagnetic waves. Such materials have an extinction coefficient from about 0.001 to about 10 and a large real dielectric constant, which may be positive or negative, from about −100 to about 1000, and a substantial paramagnetic response for time-dependent excitation, even though the material's constituents are essentially-non magnetic. These novel characteristics, in turn give rise to implementations of the conducting-rod-composite material in optical applications including new configurations for lenses, reflectors, polarizers, and wavelength selectors. Clearly, in compositions of matter and devices where the SWNT are mobile, the electromagnetic properties of the composition or device are easily modified by the change in orientation or location of the SWNT within the material in response to an applied field or its gradient. Even in materials where the SWNT are mechanically constrained, however, the known response of nanotubes to electric fields, wherein their electronic property and, therefore, their conducting behavior is modified by strong electric (see Slepyan et al. Phys. Rev. B, vol. 57, p. 9485 (1998)) and magnetic (see Lee et al, Solid State Communications vol. 115, p. 467 (2000)) fields permits the conducting-rod-composite material to function in electro-optic devices such as switches, modulators, and amplifiers. Likewise, the known response of nanotube electronic property and conductivity to electric and magnetic fields, to mechanical strains (Hertel et al., J. Phys. Chem. B, vol. 102, p. 910 (1998)) and to chemical adsorption on their surfaces (see Jing-Kong et al., Science, vol. 287 p. 622 (2000)) combined with the strong optical response of the composite material permits fabrication of optically-interrogated electrical, mechanical, and chemical sensors.

The nanotube conducting-rod composite materials comprising SWNT in a solid matrix are also electro-strictive, magneto-strictive and chemi-strictive which is to say that they change their physical dimensions in response to electric fields, magnetic fields, and chemisorption of atoms and molecules on their surfaces. This property permits their use as sensors and transducers in all the same ways as are known in the arts of other electro- and magneto-strictive materials as sensors and electro-mechanical transducers, and admits chemically-sensitive transduction as well. In some embodiments the dimensional change is more effective when an electromagnetic field is applied to the material in conjunction with the electric, magnetic, or chemical influence that initiates the dimensional change.

In all the above applications, the response of the material is made anisotropic when the nanotube elements of the material possess a collective net orientation in one direction. An appropriate choice of this orientation is used to enhance or tailor the response of a device to a particular purpose. For instance, the dielectric constant of a material of oriented nanotube segments will be enhanced for electric fields parallel to the mean direction of the constituent nanotube orientation. The mechanical electrostrictive response, depends on the elastic properties of the insulating matrix and the relative orientation of the applied electric field and net orientation of the constituent SWNT.

Polymer Coating of SWNTs and Small Ropes of SWNTs

According to one embodiment of the present invention, nanotubes are solubilized or suspended, primarily as individual tubes, in a liquid by associating them robustly with linear polymers compatible with the liquid used. (If, for example, the liquid is water, suitable polymers include, for example, polyvinyl pyrrolidone and polystyrene sulfonate.) This association is characterized by tight, relatively uniform association of the polymers with the sides of the nanotubes. This association of polymers with the sides of the nanotubes wraps the tubes in a way that inhibits electrical and physical contact between the individual tubes. The suspension or solution thus created provides an example of a novel dielectric material wherein the SWNT are mobile and do not agglomerate. When the wrapped nanotubes are removed from solution, the polymer wrapping remains, and the tubes form an aggregate in which the individual tubes are substantially electrically-isolated from one another. The material thus formed represents a "conducting rod composite" as described above.

In another embodiment of this invention, the polymeric wrappings around the tubes are cross-linked by introduction of a linking agent, forming a different material in which individual, electrically-isolated SWNT are permanently suspended in a solid cross-linked polymeric matrix.

BRIEF DESCRIPTION OF THE DRAWINGS

Various features and objects of the invention will be best appreciated with reference to a detailed description of specific embodiments of the invention, which follows, when read in conjunction with the accompanying figures, wherein:

FIGS. 3A–3D show tapping-mode atomic force micrograph (AFM) images of PVP-SWNTs on a functionalized substrate. A 5 $\mu$m-wide height image (FIG. 3A) and amplitude image (FIG. 3B), and a 1 $\mu$m-wide expanded height image (FIG. 3C) and amplitude image (FIG. 3D) are shown. The measured feature heights are consistent with individual tubes wrapped with one layer of PVP.

FIGS. 7A–7C show PVP-SWNT lengths as separated by gel electrophoresis.

DETAILED DESCRIPTION OF SPECIFIC EMBODIMENTS OF THE INVENTION

In the disclosure that follows, in the interest of clarity, not all features of actual implementations are described. It will of course be appreciated that in the development of any such actual implementation, as in any such project, numerous engineering decisions must be made to achieve the developers' specific objectives, which will vary from one implementation to another. Moreover, attention will necessarily be paid to proper engineering practices for the environment(s) in question. It will be appreciated that such a development effort might be complex and time-consuming, but would nevertheless be a routine undertaking for those of ordinary skill in the relevant fields.

Figure 1:
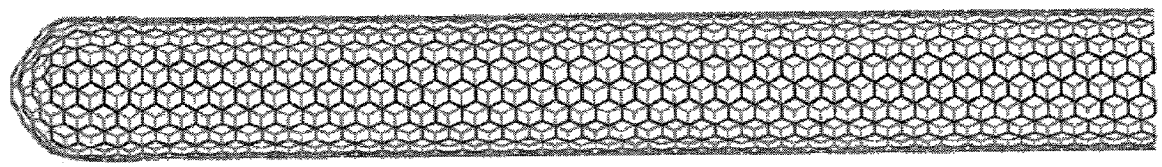
FIG. 1 is a schematic view of a single-wall carbon nanotube—one carbon atom resides at each line intersection in the figure. Depending on the production parameters, the nanotube diameter ranges from about 0.6 to about 1.6 nanometers, and the normal tube segment lengths range between 30 and 3000 nanometers.
Figure 2A:
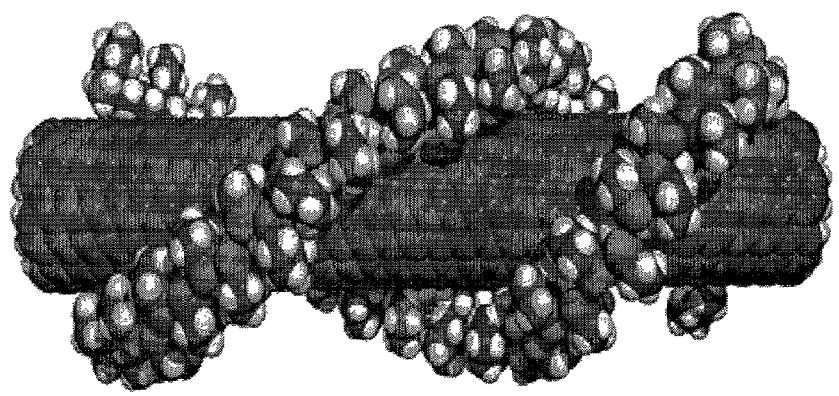
FIGS. 2A–2C show schematically how polyvinyl pyrrolidone (PVP) conforms to the SWNT, forming a wrapping that electrically isolates one tube from another. In particular, these figures show possible wrapping arrangements of polyvinyl pyrrolidone (PVP) on an (8,8) SWNT. A double helix (FIG. 2A), a triple helix (FIG. 2B), and an internal-rotation induced switch-back (FIG. 2C) are shown.
Figure 2B:
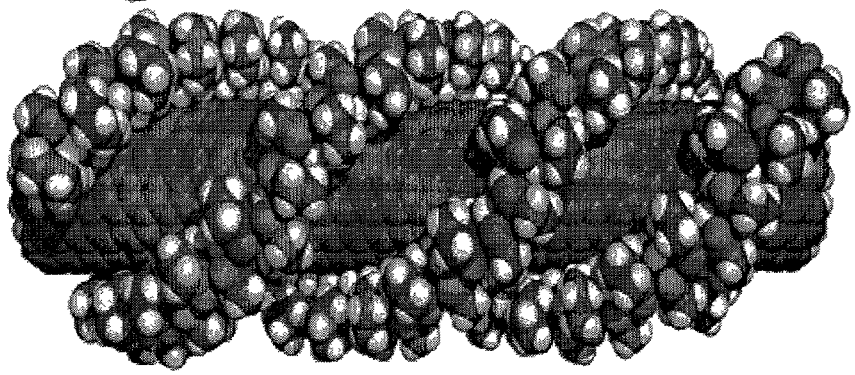
Figure 2C:
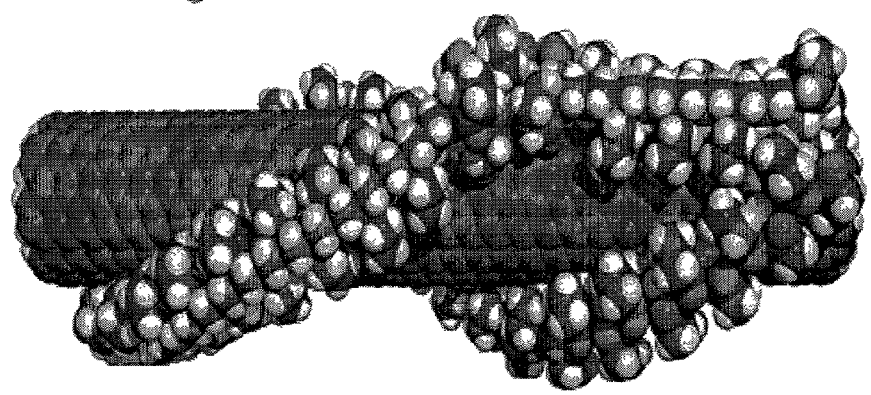

One aspect of the present invention is a composition that comprises one or more single-wall carbon nanotubes, each of which is coated at least in part with a polymer molecule. FIG. 1 illustrates a single wall carbon nanotube (SWNT), and FIGS. 2A–2C shows three possible arrangements of polymer molecules wrapped around a SWNT. FIG. 2 is illustrative of one possible means in which the similar sizes of the SWNT and polymer enable an individual polymer molecule to contact an individual SWNT at many points, establishing an effective and intimate contact between the polymer and SWNT. Although the arrangements shown in FIGS. 2A–2C are regular and symmetrical, it should be understood that the invention also encompasses arrangements in which the polymer is wrapped in a non-regular and/or non-symmetrical manner around a SWNT. In some embodiments of the invention, the polymer is present as a mono-molecular layer on the SWNT. However, it is also possible to have a thicker layer of polymer present. Likewise, while in some embodiments of the invention the polymer wraps or coats only part of the exterior surface of the SWNT, as shown in FIGS. 2A–2C, in other embodiments of the invention the SWNT may be completely coated (i.e., encapsulated) by polymer.

A variety of polymers can be used in the present invention. In some embodiments, amphiphilic polymers, such as polymer surfactants, are especially useful. An amphiphilic polymer is one that contains both hydrophobic and hydrophilic segments. Water soluble polymers are preferred in embodiments in which the solvent used to form the composition comprises water. It is also possible to use two or more different polymers to wrap the SWNT. Among the many polymers that can be used in the present invention are polyvinyl pyrrolidone (PVP), polystyrene sulfonate (PSS), poly(1-vinyl pyrrolidone-co-vinyl acetate) (PVP/VA), poly(1-vinyl pyrrolidone-coacrylic acid), poly(1-vinyl pyrrolidone-co-dimethylaminoethyl methacrylate), polyvinyl sulfate, poly(sodium styrene sulfonic acid-co-maleic acid), dextran, dextran sulfate, bovine serum albumin (BSA), poly(methyl methacrylate-co-ethyl acrylate), polyvinyl alcohol, polyethylene glycol, polyallyl amine, and mixtures thereof.

The polymer is not covalently bonded to the SWNT, therefore, the electronic, electrical, thermal, and mechanical properties of the coated single-wall carbon nanotube are substantially the same as those of an uncoated single-wall carbon nanotube. In certain embodiments of the invention, the coated carbon nanotube is prepared by a process that includes dispersing SWNT and polymer in a solvent by a method selected from the group consisting of mixing, sonication, and a combination thereof. In other embodiments of the invention, the coated carbon nanotube is prepared by a process that includes: (a) dispersing SWNT and polymer in a solvent (either simultaneously or sequentially) by a method selected from the group consisting of mixing, sonication, and a combination thereof; and (b) adding salt in a quantity effective to promote wrapping of polymer on the carbon nanotube, whereby polymer becomes wrapped on the exterior of the carbon nanotube. The SWNT can be produced by methods including the laser-oven method (described in U.S. Pat. No. 6,183,714, which is incorporated herein by reference) or the "HiPco" process (described in PCT/US99/25702, which is incorporated herein by reference). Preferably the SWNTs used in the process are substantially free (e.g., contain less than about 5% by weight) amorphous carbon.

The polymer in some embodiments of the invention is suspended in the solvent in step (a), while in other embodiments the polymer is dissolved in the solvent. As mentioned above, when an aqueous solvent is used, preferably the polymer is water-soluble. Optionally, the solvent can also comprise a surfactant that promotes wrapping of polymer on the carbon nanotube, such as sodium dodecyl sulfate (SDS). In some embodiments of the process, the concentration of carbon nanotubes in the solvent in step (a) is between about 0.1 gram/liter to about 5.0 gram/liter, and the concentration of polymer in the solvent in step (a) is between about 1.0 percent and about 5.0 percent by weight. It is often useful to heat the solvent in step (a) to a temperature at least about 40°

C., such as between about 50° C. and about 60° C., for about 0.1 to about 100 hours, more preferably for about 1 to about 50 hours.

Without being bound by theory, it is believed that the polymer has a greater affinity for the SWNT than for the solvent in which it is dissolved and/or suspended, even in a dilute solution. This affinity promotes wrapping of polymer molecules around SWNTs, and effectively solubilizes the SWNTs.

When the composition comprises a plurality of single-wall carbon nanotubes, each of which is coated at least in part with a polymer molecule, it is possible to align the SWNT by application of an external electrical field, magnetic field, or shear flow field. When this is done, preferably the plurality of carbon nanotubes are substantially aligned along their longitudinal axis (e.g., within 25° of having parallel longitudinal axes). Thus, one particular embodiment of the invention is a composition that comprises a plurality of single-wall nanotubes that are substantially aligned with one another to define a composition that is substantially anisotropic in its electrical, mechanical and thermal characteristics.

In some embodiments of the invention, the plurality of carbon nanotubes form an aggregate (such as a rope or bundle) preferably having an overall diameter less than about 10 nm. It is also possible to cross-link the polymer molecules on two or more adjacent SWNTs, thereby producing a cross-linked composite material. Another option is to place the coated SWNTs in a mass of a second polymer, whereby the coated carbon nanotubes are encapsulated in the second polymer (such as suspended in a polymer matrix). For example, the coated SWNT can be combined with a second polymer and extruded through a die to form a composite material.

Another embodiment of the invention is a method of producing a conducting rod composition of matter. This method comprises: associating a linear polymer with the sidewalls of a plurality of individual single-wall carbon nanotubes; solubilizing said plurality of single-wall carbon nanotubes in a solvent such as water; and removing said single-wall carbon nanotubes along with their associated polymers from said solvent to form an aggregate in which said individual single-wall carbon nanotubes are substantially electrically isolated from one another.

Yet another embodiment of the invention is a method of associating a polymer with the sidewalls of a plurality of individual single-wall carbon nanotubes, comprising: providing a purified single-wall carbon nanotube material substantially free of amorphous carbon; dispersing said single-wall carbon nanotube material in a polymer by a combination of high-shear mixing and ultrasonication; adding salt to bring the solution to a desired concentration of salt by weight; centrifuging the solution; decanting the solution; redispersing the material in water by mechanical agitation; and passing the dispersion through at least one filter. Preferably the salt is an alkali metal salt or an alkaline earth metal salt, such as sodium chloride. Optionally, a high gradient magnetic field (with gradients in excess of 1 Tesla/meter) can be applied to the filtered material to remove ferromagnetic particles. In certain specific embodiments of this method, the method further comprises dispersing said single-wall carbon nanotube material in at least about 1% polystyrene sulfonate, the desired concentration of sodium chloride is at least about 10%, and further comprises centrifuging at least about 60,000 g for at least about 20 minutes.

After the SWNTs have been coated with polymer, it is possible to remove the polymer coating from the nanotubes by contacting them with a solvent having a low surface tension. Suitable polymer removal solvents include chlorinated hydrocarbons such as methylene chloride. The choice of solvent will depend in part on the chemical nature of the polymer present on the SWNTs.

Another embodiment of the invention is a dielectric material comprising a plurality of single-wall carbon nanotubes, wherein each nanotube is coated at least in part with a polymer molecule, and wherein the coated nanotubes are supported in an electrically-insulating material. Suitable electrically insulating materials in which the coated nanotubes can be suspended include poly(methyl methacrylate), polystyrene, polypropylene, nylon, polycarbonate, polyolefin, polyethylene, polyester, polyimide, polyamide, epoxy, and phenolic resin. In at least some embodiments, this composite dielectric material has anisotropic electrical properties. Preferably the circumferences of the nanotubes in this dielectric material are on average less than one-tenth the average length of the individual polymer molecules.

Another embodiment of the invention is a composition that comprises a bundle of single-wall nanotubes, each nanotube being coated at least in part with a polymer, the nanotubes being substantially aligned along their longitudinal axis. The coated nanotubes form part of a chemical sensor or transducer that responds with a change of electrical and mechanical properties to the presence of specific chemicals.

Yet another embodiment of the invention is a composite dielectric material that comprises a continuous phase of dielectric material and a plurality of SWNT dispersed therein. Each SWNT is electrically isolated from adjacent SWNTs by at least a partial coat of polymer on the exterior surface of the SWNT.

Certain detailed embodiments of the invention are described below.

EXAMPLE 1

Suspension

Material is first purified to remove catalyst and amorphous carbon. See "Large-scale purification of single-wall carbon nanotubes: process, product and characterization," A. G. Rinzler, J. Liu, H. Dai, P. Nikolaev, C. B. Huffman, F. J. Rodriguez-Macias, P. J. Boul, A. H. Lu, D. Heymann, D. T. Colbert, R. S. Lee, J. E. Fischer, A. M. Rao, P. C. Eklund, R. E. Smalley, *Applied Physics A,* 67, 29 (1998)) and provisional U.S. patent application Ser. No. 60/268,228, entitled "Purified Single-Wall Carbon Nanotubes" filed Feb. 12, 2001, and provisional U.S. patent 60/284,419, entitled "Method for Purifying Single-Wall Carbon Nanotubes and Composition Thereof," filed Apr. 17, 2001, both of which are incorporated herein by reference in their entirety. The SWNT material is then dispersed in 1% polystyrene sulfonate (PSS) at a concentration of 50 mg/L by a combination of high-shear mixing and sufficient ultrasonication to ensure that primarily individual SWNTs were present. Enough sodium chloride is added to bring the solution to 10% NaCl by weight, and the dispersion is centrifuged (60,000 g, 20 min.), decanted, and re-dispersed in water by mechanical agitation. This series is repeated twice with enough sodium chloride to make 5% NaCl and 3% NaCl solutions, respectively. The resulting dispersion is passed successively through a Whatman filter, then 8 µm, 3 µm, and 1 µm polycarbonate track-etched filters, and finally a high-gradient magnetic field that removes the ferromagnetic catalyst particles remaining in the suspension.

EXAMPLE 2

Removal of Wrapping (Optional)

The PSS-SWNT complexes were dissociated by ultrasonication in concentrated phosphoric acid for 1 hour followed by washing with water. Microprobe analysis of the resulting SWNTs showed a decrease of sulfur content by over two orders of magnitude, to within baseline noise. Similarly, a suspension of NMR-silent PVP-SWNTs, upon addition of tetrahydrofuran, recovered the PVP NMR spectrum, indicating that the polymer and SWNTs were dissociated.

EXAMPLE 3

Formation of a Simple Solid Nanotube-Conducting-Rod Composite Material

Figure 6:
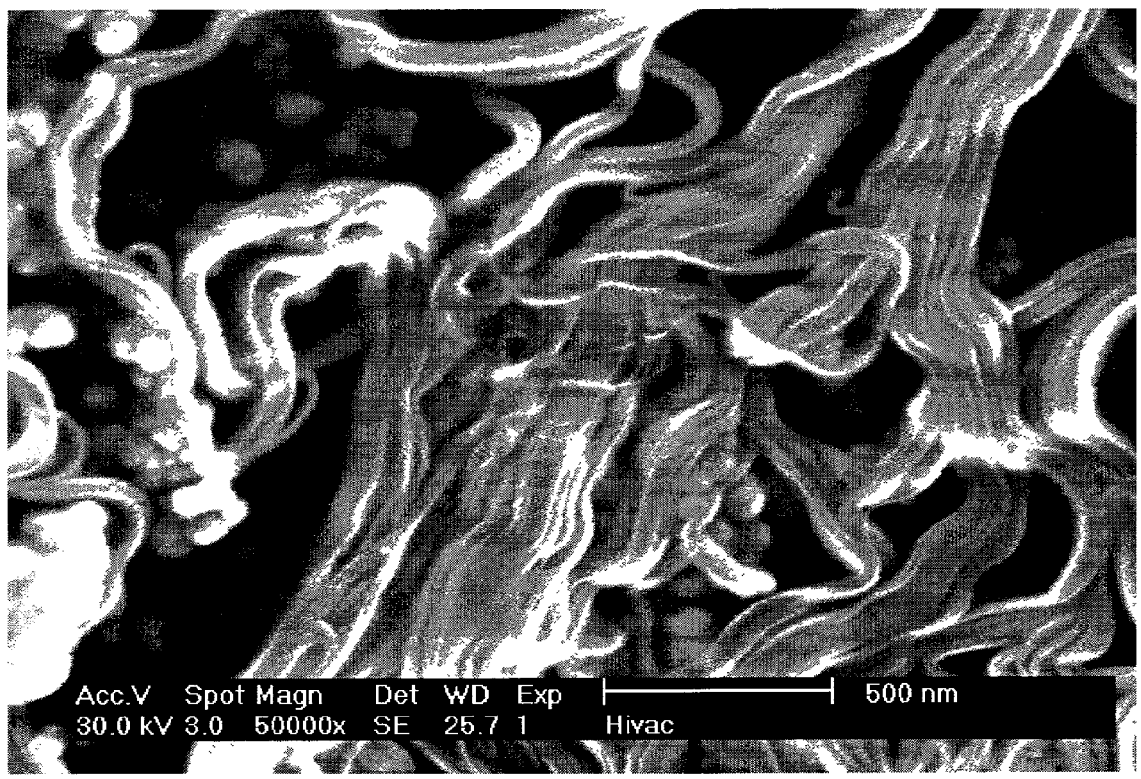
FIG. 6 is a Scanning-electron-micrograph of a material comprising >$10^4$ individually-wrapped SWNT where the wrapping polymer has been cross-linked according to one embodiment of the present invention.

PVP-wrapped SWNTs, upon centrifuging in water at 200,000 g for 2 hours, formed a gelatinous pellet that is ca. 2% SWNTs and 2–4% PVP by weight. Examination of 10–50 $\mu$m thick films between crossed polarizers revealed large (ca. 100 $\mu$m), well-defined birefringent domains, suggesting that the material behaved nematicly (FIG. 6). This further shows that the nanotube surface area is uniformly covered by the associated polymer, allowing formation of relatively large aggregates wherein the polymer-wrapped SWNT are substantially aligned with one another. The highly-polarized optical transmission observed is characteristic of a conducting-rod composite.

EXAMPLE 4

Formation of a Cross-Linked Nanotube Conducting-Rod Composite Material

To produce another embodiment of this invention, the following were mixed: 0.1% by total wt. SWNTs, 1% by total wt. PVP (50 kD), an equal amount by wt. of polyallylamine (70 kD), and 1.1 molar equivalents (with respect to PVP) of ethylene dichloride (EDC) (coupling agent). The SWNT were already wrapped by the PVP/VA (10:1 by wt.) when the polyallylamine was added. Shortly after, the EDC was added. The mixture was vortexed and filtered using a 200 nm PTFE membrane. The resulting "bucky paper" was dried at room temperature for 2 days and examined with a scanning electron microscope, producing the image shown in FIG. 6.

EXAMPLE 5

Preparation of Polymer-Wrapped Single-Wall Nanotubes

SWNTs were produced by both the laser oven methods (see A. G. Rinzler, J. Liu, H. Dai, P. Nikolaev, C. B. Huffman, F. J. Rodriguezmacias, P. J. Boul, A. H. Lu, D. Heymann, D. T. Colbert, R. S. Lee, J. E. Fischer, A. M. Rao, P. C. Eklund, R. E. Smalley, Appl. Phys. A 67 (1998) ("Rinzler 1998") 29) and HiPco (see P. Nikolaev, M. J. Bronikowski, R. K. Bradley, F. Rohmund, D. T. Colbert, K. A. Smith, R. E. Smalley, Chem. Phys. Lett. 313 (1999) ("Nikolaev 1999") 91). As received, laser-oven SWNT material (dispersed in toluene) was filtered (Whatman #41) and washed with methanol and then water. The SWNTs were then homogenized with a high-shear mixer (Polyscience X-520) and refiltered repeatedly until the filtrate was clear and colorless. HiPco SWNT material was purified by gasphase oxidation, hydrochloric acid extraction, and high-temperature annealing.

SWNT material from both sources was dispersed in 1% sodium dodecyl sulfate (SDS) in water at a concentration of 50 mg/L by a combination of high-shear mixing and sufficient ultrasonication to ensure that primarily individual SWNTs were present, as evaluated by AFM. See J. Liu, M. J. Casavant, M. Cox, D. A. Walters, P. Boul, W. Lu, A. J. Rimberg, K. A. Smith, D. T. Colbert, R. E. Smalley, Chem. Phys. Lett. 303 (1999)125. Enough polyvinyl pyrrolidone (PVP) was added to the mixture to result in a 1% solution by weight, which was then incubated at 50° C. for 12 hours. The mixture was passed through a 1 $\mu$m track-etched polycarbonate filter. Catalyst particles remaining from the SWNT synthesis were then removed by passing the dispersion through a High Gradient Magnetic Separator (HGMS). Residual SDS and polymer were removed by at least three cycles of high-speed centrifugation (200,000 g, 2 hours), decanting, and redispersion in pure water by mechanical agitation including mild (ten minutes or less) ultrasonication to produce a stable solution of PVP wrapped SWNTs (PVP-SWNTs) in water, uniformly dispersible up to 1.4 g/L.

EXAMPLE 6

Solubilization by Polymer Wrapping

AFM images of PVP-SWNT supramolecular aggregates adsorbed onto amine-functionalized substrates show SWNT height and length distributions consistent with the notion that most of the complexes consist of a single SWNT associated with at most a monolayer of polymer, and a smaller percentage of ropes consisting of more than one SWNT (FIGS. 3A–3D). The solutions formed are stable for months, and easily pass through a 1 $\mu$m track-etched polycarbonate filter membrane. When the material is dried, it is easily redissolved into pure water with minimal ultrasonication, in dramatic contrast to dried non-polymer-wrapped SWNT material in any other solvent system.

Figures 4A, 4B:
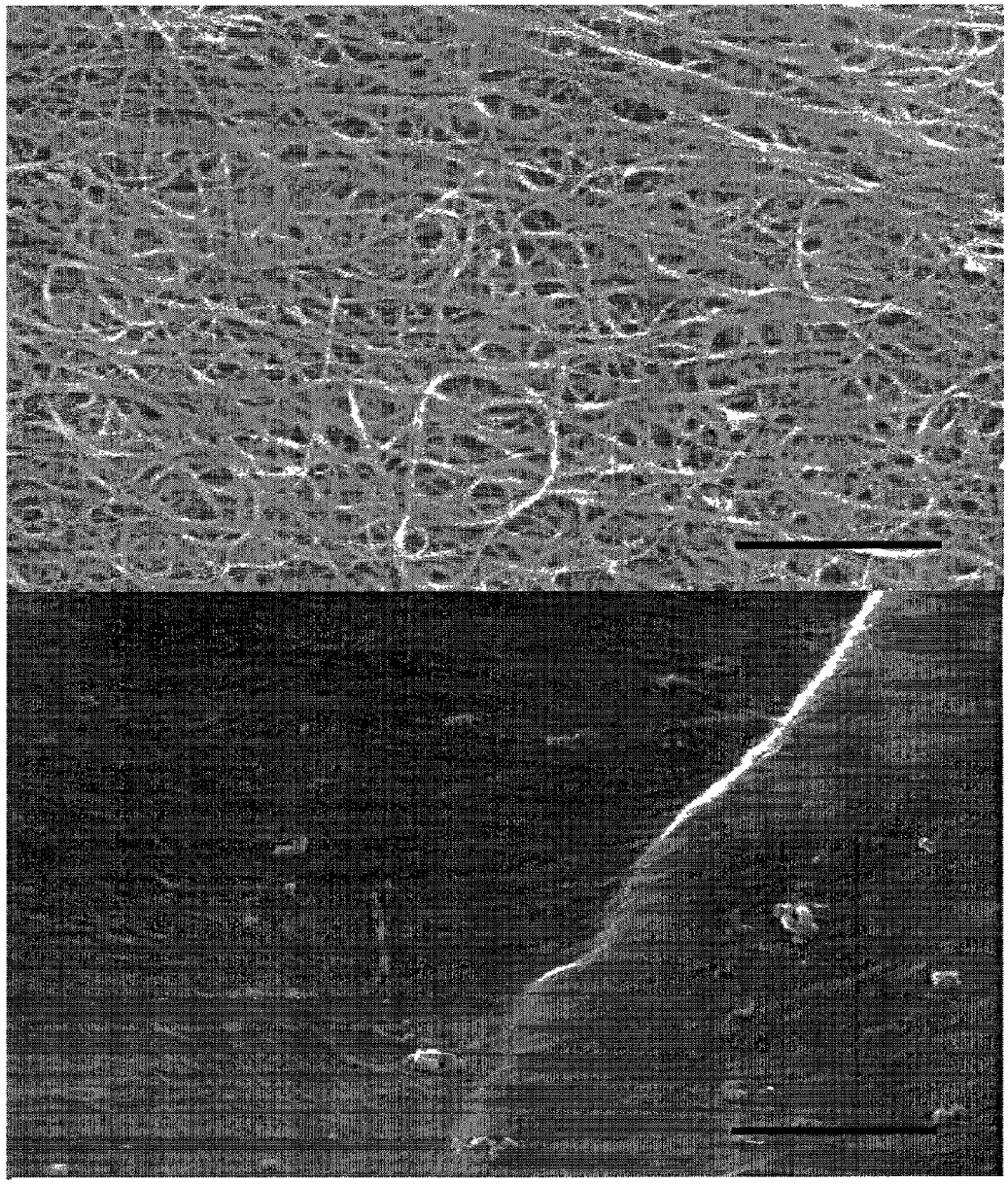
FIGS. 4A–4B show typical filter cake formed by filtering un-wrapped SWNTs from organic or surfactant suspension, consisting of large ropes (FIG. 4A), and filter cake formed by filtering PVP-wrapped SWNTs (FIG. 4B). Scale bars are 500 nm. The spaghetti-like structures shown in FIG. 4A form because the strong Van der Waals attraction for the bare tubes cause their aggregation into "ropes". The "wrapping" distances the tubes from one another, essentially eliminating the short-range Van der Waals attraction, and the tubes do not form ropes. The clear difference in the morphology of these filter cakes demonstrates the effectiveness of isolation of one tube from its neighbors.

Solubility is a measure of an equilibrium between the dissolved phase and the aggregated phase, so one component to increasing solubility could be the destabilization of the solid. The smooth, uniform interaction surface along pristine SWNTs allows a remarkably robust van der Waals interaction between them. The pair-wise interaction potential between parallel SWNTs has recently been determined by a continuum model. See L. A. Girifalco, M. Hodak, R. S. Lee, Phys. Rev. B 62 (2000) 13104. For every nanometer of overlap between two (10,10) tubes, the binding energy is 950 meV. Thus, summed for a typical SWNT length of 100 nm embedded in a rope, the cohesive energy is a staggering 2.9 keV. It might be expected, therefore, that modifications to the SWNTs that disrupt the uniform interactions along their lengths in a hexagonally packed crystal would shift their equilibrium in solvents toward the dissolved phase. Such modifications could be side-wall functionalization, (see P. J. Boul, J. Liu, E. T. Mickelson, C. B. Huffman, L. M. Ericson, I. W. Chiang, K. A. Smith, D. T. Colbert, R. H. Hauge, J. L. Margrave, R. E. Smalley, Chem. Phys. Lett. 310 (1999) ("Boul 1999") 367) end-cap functionalization, (see J. Chen, M. A. Hamon, H. Hu, Y. S. Chen, A. M. Rao, P. C. Eklund, R. C. Haddon, Science 282 (1998) 95) or wrapping the SWNTs with a polymer. In filtered papers made from non-wrapped SWNT dispersions (FIG. 4A), the tubes self-assemble into mats of tangled, seemingly endless ropes, wherein a majority of the tubes are in direct van der Waals contact with other SWNTs along their entire length. See Rinzler 1998, 29. Filtered papers of PVP-SWNTs, on the other hand, exhibit no such large-scale structure (FIGS. 4B).

EXAMPLE 7

Robust Association Between Polymer and SWNTs

A modified flow field-flow fractionation (FFF) technique was used to test the stability of polymer wrapping. 20 μL of a dissolved 0.46 g/L PVP-SWNTs were injected into the Flow FFF instrument (Universal Fractionator Model F-1000, FFFractionation, LLC) with zero crossflow and a channel flow of water with 0.02% sodium azide (a bactericide). When the sample entered the cross-flow region, the channel flow was halted and a cross-flow of 0.5 mL/min. was initiated, pinning the sample against the accumulation membrane. The sample was washed by the cross-flow against the membrane for 40 min., after which the cross-flow was halted and the channel flow reinitiated, allowing the sample to be collected when it exited the Flow FFF. The final samples were compared to the starting material by tapping-mode AFM, and found to be unchanged within experimental error. The observed length distribution was 137±130 nm before and 167±138 nm after. In all cases, a large percentage of the tubes had heights consistent with known individual nanotube heights plus a monolayer coating of the polymer. No nanotubes were observed surviving this treatment in a control experiment where the SWNTs were suspended by Triton X-100.

During the sample preparation, the Nuclear Magnetic Resonance (NMR) signal for the polymer disappeared after several centrifugation/decanting/resuspension cycles, although by absorption spectroscopy there is still a significant amount of polymer left in solution. We conclude that the polymer that is tightly associated with the SWNTs is dramatically broadened by some combination of factors, including inhomogeneities in the local magnetic field induced by the diameter and helicity dependent diamagnetism of the SWNTs themselves (i.e., an 'antenna' effect), the slow motion of such large objects in solution preventing rotational averaging, and the at least partial alignment of the SWNTs in the magnetic field. See J. Hone, M. C. Llaguno, N. M. Nemes, A. T. Johnson, J. E. Fischer, D. A. Walters, M. J. Casavant, J. Schmidt, R. E. Smalley, Appl. Phys. Lett. 77 (2000) 666 and B. W. Smith, Z. Benes, D. E. Luzzi, J. E. Fischer, D. A. Walters, M. J. Casavant, J. Schmidt, R. E. Smalley, Appl. Phys. Lett. 77 (2000) 663. Therefore, NMR spectroscopy quantifies the amount of free polymer in solution, and by subtraction from the total amount of polymer as determined by absorption spectroscopy, the amount of polymer that is associated with the SWNTs is quantified. These NMR measurements are possible due to recent developments in the purification techniques for SWNTs, particularly with respect to removing residual metal catalyst from the samples.

Taken together, these results are strong evidence that the polymer and SWNT comprise a single entity that can be manipulated as a whole, rather than solubilization by a dynamic equilibrium of the supramolecular association.

EXAMPLE 8

Tight, Uniform Wrapping

The individual PVP-SWNTs appear by AFM to be of uniform diameter along their lengths with heights consistent with monolayer coverage of the SWNTs, supporting the interpretation that the polymer is uniformly wrapped around the tubes rather than associated with the side-walls at various points as random coils.

Figure 5:
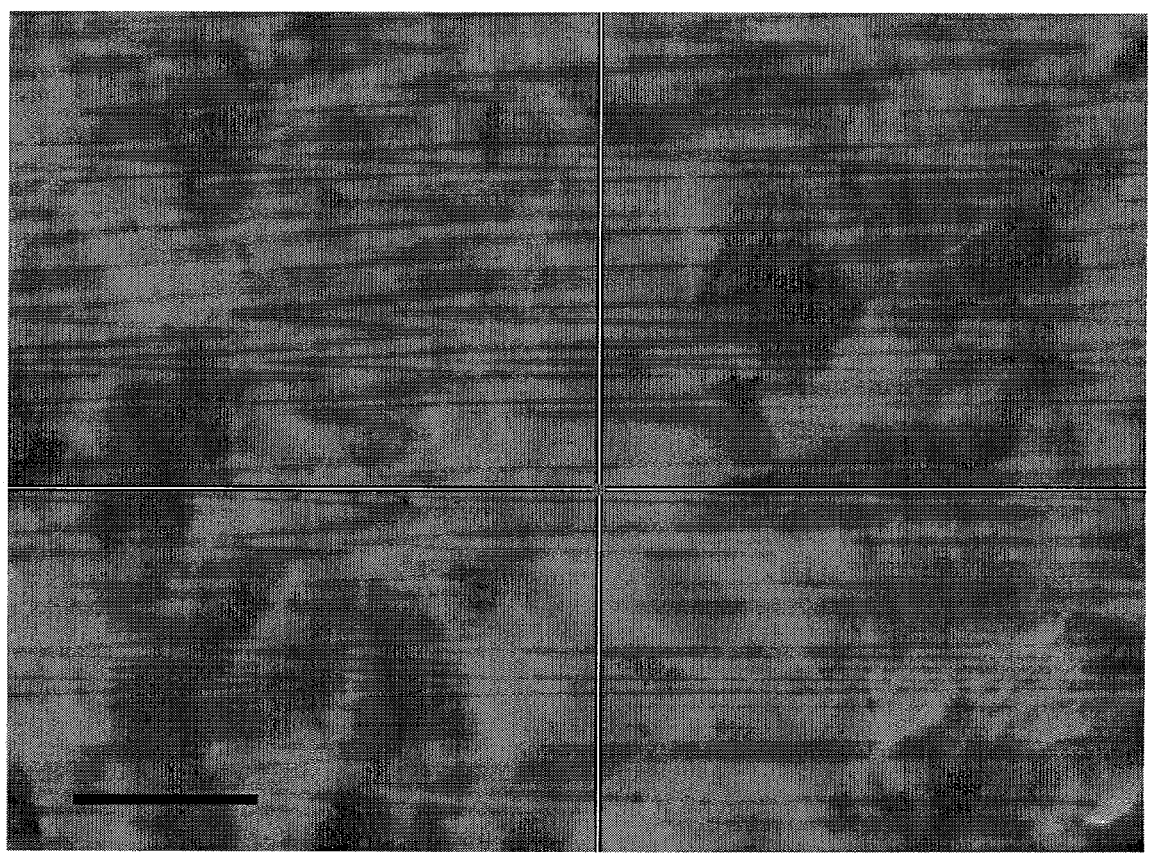
FIG. 5 is an optical-micrograph showing birefringent domains of PVP-coated SWNT material as observed between crossed polarizers. Scale bar is 0.04 mm.

PVP-SWNTs, after centrifuging in water at 200,000 g for 2 hours, formed a gelatinous pellet that was found to be ca. 2% SWNTs and 2% PVP by weight. Examination of 10–50 μm thick films between crossed polarizers revealed large (ca. 100 μm), well-defined birefringent domains, suggesting that the material behaves nematicly (FIG. 5). This further supports the interpretation that the nanotube surface area is uniformly covered by the associated polymer. The system is almost certainly a nematic solid, and may require the traditional addition of highly entropic side chains to transform the material into a true liquid crystal.

At maximum coverage, the 40 kD PVP:SWNT ratio by weight was found to be 5:8 for HiPco material and 1:1 for laser oven material. 360 kD PVP was found to associate with the SWNTs at higher ratios, 1.7:1 and 2:1 for laser-oven material and HiPco material, respectively. It is likely that these longer polymers are more likely to entangle during the wrapping process, thus associating more unwrapped polymer for a given surface-area coverage. Furthermore, assuming the same polymer/SWNT surface area ratio as observed in the 40 kD case, which corresponds to the simple case in which the polymer executes a helical wrapping of the tube, covering the tube with a monolayer of polymer (such as the illustrated forms in FIGS. 2A and 2B), a single strand of 360 kD PVP would more than cover the entire surface area of a single SWNT of the typical observed length.

EXAMPLE 9

Wrapping: A General Phenomenon

SWNTs can also be successfully solubilized by wrapping with other polymers, including polystyrene sulfonate (PSS), poly(1-vinyl pyrrolidone-co-vinyl acetate) (PVPNA), poly (1-vinyl pyrrolidone-coacrylic acid), poly(1-vinyl pyrrolidone-co-dimethylaminoethyl methacrylate), polyvinyl sulfate, poly(sodium styrene sulfonic acid-co-maleic acid), dextran, dextran sulfate, and bovine serum albumin (BSA). Although polymers including poly(methyl methacrylate-co-ethyl acrylate), polyvinyl alcohol, polyethylene glycol, and polyallyl amine were initially unsuccessful in solubilizing SWNT by wrapping, subsequent tests indicated that they can successfully solubilize SWNT by wrapping.

Although not to be bound by theory, a rational interpretation of the examples indicates that the wrapping of the SWNTs by water-soluble polymers is a general phenomenon, driven largely by a thermodynamic drive to eliminate the hydrophobic interface between the tubes and their aqueous medium. Within this interpretation, changing the solvent system to remove the strong hydrophobic thermodynamic penalty should induce the PVP-SWNT complexes to dissociate, and in fact NMR-silent PVP-SWNTs, upon addition of tetrahydrofuran, recovers the PVP NMR spectrum.

This can be understood by estimating the dominant thermodynamic factors in wrapping an idealized water-soluble polymer around a SWNT. Due to the free-rotation about the backbone bonds in the polymers studied here, they generally form random coils in solution. The entropic cost of forcing a linear polymer into a wrapping conformation around a nanotube can be estimated as being at most that of restricting each polymer backbone bond to one of its three rotational minima, which is simply $$\Delta S = -k \cdot \ln(W) = -k \cdot \ln(3^{n-2}) = -k(n-2)\ln(3),$$

where n is the number of backbone carbon atoms. In an effort to evaluate the generality of a proposed thermodynamic driving force, we will consider the isoenergetic case, recognizing that polymers with favorable enthalpic interactions can likely be chosen (e.g., PVP is a close polymer analog to n-methyl pyrrolidone (NMP), an excellent solvent for laser-oven SWNTs. See K. D. Ausman, R. Piner, O. Lourie, R. S. Ruoff, M. Korobov, J. Phys. Chem. B 104 (2000) 8911. From the observed 40 kD PVP:SWNT mass ratio and assuming a 1.0 nm diameter tube. See Nikolaev (1999), 91. We find an average of 8.1 monomer units per nanometer of HiPco SWNT, resulting in an entropic penalty of ca. 56 J/mol K. Assuming a negligible enthalpic contribution to the free energy as discussed above, this gives a maximum free energy penalty for polymer conformational restriction at 25° C. of 17 kJ/mol per nm of SWNT wrapped.

Offsetting this effect is the loss of hydrophobic surface achieved by shielding the nanotube from the water in which it is immersed, which for SWNTs can be estimated from the surface tension of the corresponding hydrophobic cavity. For a cavity the size of a 1.0 nm diameter nanotube, this is ca. 136 kJ/mol for each nm of SWNT length at room temperature. Clearly, the free energy cost of forcing the polymeric wrapping into a regular wrapping arrangement is significantly smaller than the gain achieved by overcoming the hydrophobic penalty between the SWNTs and their surrounding water.

Of the successful wrapping polymers, the ionic polymers provide an instructive contrast to the nonionic case described. PSS, for example, solubilized SWNT material up to 4.1 g/L. However, during the wrapping procedure, the higher ionic strength of the solutions induced aggregation during the wrapping step as a consequence of electric double-layer solubilization, requiring that the dispersion and association steps take place simultaneously. This double-layer effect could be used to good advantage, however, in the purification step through intentional salting-out of the ionic-polymer wrapped SWNTs, significantly reducing the required centrifugation forces. The absorption spectroscopy/NMR technique for quantifying the amount of wrapping polymer present was verified in this case by electron microprobe analysis for sulfur content. PSS-SWNTs had less-reproducible polymer to SWNT mass ratios than did PVP-SWNTs, ranging up to 1:2 and 2:1 for laser oven and HiPco materials, respectively. This irreducibility is a result of a lower binding of polymer to the tubes, as evinced by the continued removal of polymer by repeated centrifugation/decanting/resuspension steps. Removing the PSS wrapping by ultrasonication in concentrated phosphoric acid for 1 hour followed by washing with water reduced the sulfur microprobe signal by over two orders of magnitude, to within baseline noise.

EXAMPLE 10

Molecular Picture

From the key observations described, solubilization with near-monolayer coverage of tightly-associated polymer around individual SWNTs, a molecular-level picture of the association geometry is suggested: helical wrapping. A single tight coil, however, would necessarily introduce significant bond-angle strain in the polymer backbone, enough to offset the thermodynamic drive for wrapping described above. Multi-helical wrapping (FIGS. 2A–2C), on the other hand, allows high surface-area coverage with low backbone strain, where, at least locally, multiple strands of polymer coil around the SWNT at close to their nascent backbone curvature. Given such a picture, it is natural to expect that successive strands of polymer wrapping would have different binding constants, particularly when the polymer strand is charged as in the case of PSS, explaining the lower binding of PSS relative to PVP.

EXAMPLE 11

Biologically Relevant Conditions

PSS-SWNTs are largely solubilized by the electric double-layer effect, making solution stability sensitive to its ionic strength. HiPco PSS-SWNT solutions at a concentration of 11 mg/L of tubes salt out at NaCl concentrations of 20±5 mM, and $MgCl_2$ concentrations of 2±1 mM. PVP-SWNTs also salt out, albeit at higher ionic strengths (135±20 mM NaCl and 10±2 $MgCl_2$ for 11 mg/L of tubes), suggesting that these tubes also carry a charge, similar to the dimethylformamide and dimethylsulfoxide dispersions of SWNTs previously reported. See Boul (1999), 367. The solution stability of PVP-SWNTs at these high ionic strengths raises the possibility that a similar system will be solubilized in biologically-relevant conditions. BSA and dextrans also stably solubilized SWNTs at high ionic strengths, more directly making the connection to the biological world.

EXAMPLE 12

Applications

The solubilization of SWNTs by the procedures described here opens up the possibility of functionalization chemistry, both on the tubes themselves and on the wrapping polymer, and solution-phase separations. For example, purification of the SWNTs from any residual catalytic material can be efficiently performed by high gradient magnetic separation. Also, PVP-SWNTs can be length-fractionated by gel electrophoresis. Fractions, as measured from a maximum migration of 18 cm along a 0.5% agarose gel in a glycine/SDS buffer and subjected to 100 V for five hours, were investigated by AFM to reveal significant separation by length (FIG. 7).

Single-walled carbon nanotubes have been reversibly solubilized in water by wrapping them with a variety of linear polymers. It was demonstrated that the association between the polymer and the SWNT is robust, not dependent upon the presence of excess polymer in solution, and is uniform along the sides of the tubes. A general thermodynamic driving force for such wrapping in an aqueous environment has been identified. This solubilization provides a route to more precise manipulation, purification, fractionation, and functionalization than was before possible, as well as allowing SWNTs to be introduced to biologically-relevant systems.

EXAMPLE 13

High Dielectric Constant material

A suspension of PVP-wrapped nanotubes was prepared according to the procudure of example 5. After the sample was completely reacted, it is dried for further analysis. This was done by using the aspirator filtration apparatus with a 100 nm or less pore size track-etched polycarbonate filtration membrane. The SWNTs were captured on the filter membrane and form a bucky paper. This bucky paper was allowed to air-dry to remove as much of the liquid as possible.

The bucky paper prepared in this way with dimensions approximately 0.8 cm by 1.2 cm and a thickness of 0.012 cm was clamped securely between two lead/indium foil electrodes. The electrodes were connected to a Hewlett Packard 4284A (20 Hz–1 MHz) Precision LCR Meter. This measurement indicated a dielectric constant of ranging between 600 and 800 over the frequency range of 1 megahertz to 500 hertz with an applied RMS ac voltage of 200 mV applied between the foil electrodes.

From the foregoing detailed description of specific embodiments of the invention, it should be apparent that methods and apparatuses involving materials containing single-wall carbon nanotubes and non-covalently derivatized single-wall carbon nanotubes have been disclosed. Although specific embodiments and implementation alternatives have been disclosed herein, this has been done solely for the purposes of describing the invention in its various aspects, and is not intended to be limiting with the scope of the invention as defined in the claims accompanying this application and/or a non-provisional counterpart to this application. It is contemplated that various substitutions, alterations, and or modifications, including but not limited to those which may have been discussed or suggested herein, may be made to the disclosed embodiment(s) without departing from the spirit and scope of the invention.

What is claimed is:

1. A dielectric material comprising a plurality of single-wall carbon nanotubes coated at least in part with a polymer molecule, wherein the polymer-coated single-wall carbon nanotubes are substantially electrically-isolated from one another.

2. A dielectric material in accordance with claim 1, wherein the single-wall carbon nanotubes are smaller on average in their circumference than the average length of the individual polymer molecules.

3. A structure comprising a dielectric material in accordance with claim 1, wherein the structure is selected from the group consisting of capacitor dielectrics, circuit board materials, waveguide materials, optical index-matching materials, electromagnetic radiation absorbing materials, electromagnetic radiation re-directing materials, optoelectronic materials, antenna arrays, materials for suspending antennas, electrically-loading antennas, and supports of antenna arrays.

4. A dielectric material in accordance with claim 1, wherein the polymer-coated single-wall carbon nanotubes are embedded in a polymer matrix.

5. A dielectric material in accordance with claim 4, wherein the polymer matrix is an electrically-insulating polymer material.

6. A dielectric material in accordance with claim 1, wherein a dielectric constant of said dielectric material is at least about 10.

7. A dielectric material in accordance with claim 1, wherein a dielectric constant of said dielectric material is at least about 100.

8. A dielectric material in accordance with claim 1, wherein a dielectric constant of said dielectric material is at least about 500.

9. A dielectric material comprising a plurality of aggregates of single-wall carbon nanotubes, wherein the aggregates are coated at least in part with a polymer molecule and wherein the aggregates of single-wall carbon nanotubes are substantially electrically-isolated from one another.

10. A dielectric material in accordance with claim 9, wherein the aggregates of single-wall carbon nanotubes comprise ropes of single-wall carbon nanotubes in which the nanotubes are substantially aligned along the longitudinal axes of the ropes.

11. A dielectric material in accordance with claim 9, wherein the aggregates of single-wall carbon nanotubes comprise bundles of single-wall carbon nanotubes in which the nanotubes are substantially aligned along the longitudinal axes of the bundles.

12. A dielectric material in accordance with claim 9, wherein the aggregates of single-wall carbon nanotubes are smaller on average in their circumference than the average length of the individual polymer molecules.

13. A structure comprising a dielectric material in accordance with claim 9, wherein the structure is selected from the group consisting of capacitor dielectrics, circuit board materials, waveguide materials, optical index-matching materials, electromagnetic radiation absorbing materials, electromagnetic radiation re-directing materials, optoelectronic materials, antenna arrays, materials for suspending antennas, electrically-loading antennas, and supports of antenna arrays.

14. A dielectric material in accordance with claim 9, wherein the polymer-coated aggregates of single-wall carbon nanotubes are embedded in a polymer matrix.

15. A dielectric material in accordance with claim 14, wherein the polymer matrix is an electrically-insulating polymer material.

16. A structure comprising a dielectric material in accordance with claim 14, wherein the structure is selected from the group consisting of capacitor dielectrics, circuit board materials, waveguide materials, optical index-matching materials, electromagnetic radiation absorbing materials, electromagnetic radiation re-directing materials, optoelectronic materials, antenna arrays, materials for suspending antennas, electrically-loading antennas, and supports of antenna arrays.

17. A dielectric material in accordance with claim 9, wherein a dielectric constant of said dielectric material is at least about 10.

18. A dielectric material in accordance with claim 9, wherein a dielectric constant of said dielectric material is at least about 100.

19. A dielectric material in accordance with claim 9, wherein a dielectric constant of said dielectric material is at least about 500.

20. A method comprising:
    (a) selecting a plurality of coated single-wall carbon nanotubes, wherein the coated single-wall carbon nanotubes are coated at least in part with a polymer molecule; and
    (b) contacting a species with the coated single-wall carbon nanotubes to effect a chemical adsorption of the species on the surface of the coated single-wall carbon nanotubes, wherein the coated single-wall carbon nanotubes change dimensionally, electronically, or both in response to the chemical adsorption.

21. The method in accordance with claim 20, wherein the coated single-wall carbon nanotubes are part of a chemical sensor that responds to at least one of (i) the dimensional change of the coated single-wall carbon nanotubes and (ii) the electronic change of the coated single-wall carbon nanotubes.

22. The method in accordance with claim 20, wherein the coated single-wall carbon nanotubes are part of a transducer that responds to at least one of (i) the dimensional change of the coated single-wall carbon nanotubes and (ii) the electronic change of the coated single-wall carbon nanotubes.

23. A method comprising:
   (a) selecting aggregates of coated single-wall carbon nanotubes, wherein the aggregates of coated single-all carbon nanotubes are coated at least in part with a polymer molecule; and
   (b) contacting a species with the coated aggregates of single-wall carbon nanotubes to effect a chemical adsorption of the species on the surface of the coated aggregates of single-wall carbon nanotubes, wherein the coated aggregates of single-wall carbon nanotubes change dimensionally, electronically, or both in response to the chemical adsorption.

24. The method in accordance with claim 23, wherein the coated aggregates of single-wall carbon nanotubes comprise ropes of single-wall carbon nanotubes in which the single wall carbon nanotubes in the ropes are substantially aligned along their longitudinal axes.

25. The method in accordance with claim 23, wherein the coated aggregates of single-wall carbon nanotubes are part of a chemical sensor that responds to at least one of (i) the dimensional change of the coated single-wall carbon nanotubes and (ii) the electronic change of the coated single-wall carbon nanotubes.

26. The method in accordance with claim 23, wherein the coated aggregates of single-wall carbon nanotubes are part of a transducer that responds to at least one of (i) the dimensional change of the coated single-wall carbon nanotubes and (ii) the electronic change of the coated single-wall carbon nanotubes.

27. A method comprising:
   (a) selecting a fluid comprising a dispersion of a plurality of single-wall carbon nanotubes coated at least in part with a polymer; and
   (b) controlling the viscosity of the fluid by applying to the fluid a field selected from the group consisting of an electric field, a magnetic field and combinations thereof.

28. A method comprising:
   (a) selecting a fluid comprising a dispersion of a plurality of aggregates of single-wall carbon nanotubes, wherein the aggregates are coated at least in part with a polymer;
   (b) controlling the viscosity of the fluid by applying to the fluid a field selected from the group consisting of an electric field, a magnetic field and combinations thereof.

29. A method in accordance with claim 28, wherein the aggregates of single-wall carbon nanotubes comprise ropes of single-wall carbon nanotubes in which the single-wall carbon nanotubes in the ropes are substantially aligned along their longitudinal axes.

30. A method in accordance with claim 28, wherein the aggregates of single-wall carbon nanotubes comprise bundles of single-wall carbon nanotubes in which the single-wall carbon nanotubes in the bundles are substantially aligned along their longitudinal axes.

31. A film comprising a plurality of aggregates of single-wall carbon nanotubes, wherein:
   (a) the aggregates of single-wall carbon nanotubes are coated at least in part with a polymer; and
   (b) the film is a dielectric material, wherein the aggregates of single-wall carbon nanotubes are substantially electrically-isolated from one another.

32. A film in accordance with claim 31, wherein the single-wall carbon nanotube aggregate comprises a rope of single-wall carbon nanotubes in which the nanotubes are substantially aligned along their longitudinal axes.

33. A film in accordance with claim 32, wherein the single-wall carbon nanotube aggregate comprises a bundle of single-wall carbon nanotubes in which the nanotubes are substantially aligned along their longitudinal axes.

34. A fiber comprising a plurality of aggregates of single-wall carbon nanotubes, wherein:
   (a) the aggregates of single-wall carbon nanotubes are coated at least in part with a polymer; and
   (b) the fiber is a dielectric material, wherein the aggregates of single-wall carbon nanotubes are substantially electrically-isolated from one another.

35. A fiber in accordance with claim 34, wherein the single-wall carbon nanotube aggregate comprises a rope of single-wall carbon nanotubes in which the nanotubes are substantially aligned along their longitudinal axes.

36. A fiber in accordance with claim 34, wherein the single-wall carbon nanotube aggregate comprises a bundle of single-wall carbon nanotubes in which the nanotubes are substantially aligned along their longitudinal axes.

37. A method comprising:
   (a) selecting a plurality of coated single-wall carbon nanotubes, wherein the coated single-wall carbon nanotubes are coated at least in part with a polymer molecule; and
   (b) applying an electric field, wherein the coated single-wall carbon nanotubes change dimensionally, electronically, or both in response to the applied electric field.

38. The method in accordance with claim 37, wherein the coated single-wall carbon nanotubes are part of a transducer that responds to at least one of (i) the dimensional change of the coated single-wall carbon nanotubes and (ii) the electronic change of the coated single-wall carbon nanotubes.

39. A method comprising:
   (a) selecting a composition comprising a plurality of coated single-wall carbon nanotubes, wherein the coated single-wall carbon nanotubes are coated at least in part with a polymer molecule; and
   (b) applying a magnetic field, wherein the composition changes dimensionally, electronically, or both in response to the applied magnetic field.

40. The method in accordance with claim 39 wherein the composition is part of a transducer that responds to at least one of (i) the dimensional change of the composition and (ii) the electronic change of the composition.

41. A method comprising:
   (a) selecting a composition comprising a plurality of coated single-wall carbon nanotubes, wherein the coated single-wall carbon nanotubes are coated at least in part with a polymer molecule; and
   (b) contacting a species with the composition to effect a chemical adsorption of the species on the surface of the coated single-wall carbon nanotubes, wherein the coated single-wall carbon nanotubes change dimensionally, electronically, or both in response to the chemical adsorption.

42. The method in accordance with claim 41, wherein the composition is part of a chemical sensor that responds to at least one of (i) the dimensional change of the composition and (ii) the electronic change of the composition.

43. The method in accordance with claim 41, wherein the composition is part of a transducer that responds to at least one of (i) the dimensional change of the composition and (ii) the electronic change of the composition.

44. A method comprising:
   (a) selecting a composition comprising coated aggregates of single-wall carbon nanotubes, wherein the coated aggregates of single-wall carbon nanotubes are coated at least in part with a polymer molecule; and
   (b) contacting a species with the composition to effect a chemical adsorption of the species on the surface of the coated aggregates of single-wall carbon nanotubes, wherein the coated aggregates of single-wall carbon nanotubes change dimensionally, electronically, or both in response to the chemical adsorption.

45. The method in accordance with claim 44, wherein the coated aggregates of single-wall carbon nanotubes comprise ropes of single-wall carbon nanotubes in which the single-wall carbon nanotubes are substantially aligned along the longitudinal axes of the ropes.

46. The method in accordance with claim 44, wherein the composition is part of a chemical sensor that responds to at least one of (i) the dimensional change of the composition and (ii) the electronic change of the composition.

47. The method in accordance with claim 44, wherein the composition is part of a transducer that responds to at least one of (i) the dimensional change of the composition and (ii) the electronic change of the composition.

48. A method comprising:
   (a) selecting a composition comprising coated aggregates of single-wall carbon nanotubes, wherein the coated aggregates of single-wall carbon nanotubes are coated at least in part with a polymer molecule; and
   (b) applying an electric field, wherein the composition changes dimensionally, electronically, or both in response to the applied electric field.

49. The method in accordance with claim 48, wherein the coated aggregates of single-wall carbon nanotubes comprise ropes of single-wall carbon nanotubes in which the single-wall carbon nanotubes are substantially aligned along the longitudinal axes of the ropes.

50. The method in accordance with claim 48, wherein the composition is part a transducer that responds to at least one of (i) the dimensional change of the composition and (ii) the electronic change of the composition.

51. A method comprising:
   (a) selecting a composition comprising coated aggregates of single-wall carbon nanotubes, wherein the coated aggregates of single-wall carbon nanotubes are coated at least in part with a polymer molecule; and
   (b) applying a magnetic field, wherein the composition changes dimensionally, electronically, or both in response to the applied magnetic field.

52. The method in accordance with claim 51, wherein the coated aggregates of single-wall carbon nanotubes comprise ropes of single-wall carbon nanotubes in which the single-wall carbon nanotubes are substantially aligned along the longitudinal axes of the ropes.

53. The method in accordance with claim 51, wherein the composition is part of a transducer that responds to at least one of (i) the dimensional change of the composition and (ii) the electronic change of the composition.

* * * * *